(12) United States Patent
Chen et al.

(10) Patent No.: US 6,228,170 B1
(45) Date of Patent: May 8, 2001

(54) METHOD AND APPARATUS FOR REGULATING CHAMBER PRESSURE

(75) Inventors: F. H. Chen, Tsai-Liao Village; C. L. Wu, Chu-Pei; Y. B. Lin, Lung-Tan Village, all of (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 08/991,293

(22) Filed: Dec. 16, 1997

(51) Int. Cl.[7] .................................................. C23C 16/52
(52) U.S. Cl. .......................................... 118/663; 118/715
(58) Field of Search ................................ 62/63; 118/663, 118/715; 156/345; C23C 16/44, 16/52; H01L 21/205, 21/31

(56) References Cited

U.S. PATENT DOCUMENTS 5,605,049 * 2/1997 Moore et al. ............................. 62/63

FOREIGN PATENT DOCUMENTS

403105914A * 5/1991 (JP) .............................. H01L/2/205
404128379A * 4/1992 (JP) ................................. C23C/1/44

OTHER PUBLICATIONS

Kimizuka, Masakatsu; Ozaki, Yoshiharu, Pattern profile control of polysilicon in magnetron reactive ion etching, J. Vac. Sci. Technol. B 15(2), Mar. 1, 1997.*

* cited by examiner

Primary Examiner—Gregory Mills
Assistant Examiner—Rudy Zervigon
(74) Attorney, Agent, or Firm—Tung & Associates

(57) ABSTRACT

The present invention discloses an apparatus for regulating chamber pressure in a process chamber by a closed-loop control method utilizing a pressure sensor, a pressure controller and an inverter for regulating the rotational speed of an exhaust blower such that the exhaust pressure in a factory exhaust conduit can be substantially controlled at a constant value. The present invention novel method and apparatus allows a more stable chamber pressure to be maintained in an APCVD or LPCVD chamber, while substantially reduces the possibility of particulate contamination on a throttle valve that is mounted juxtaposed to the process chamber and thus minimizing any back-fill contamination problems.

13 Claims, 1 Drawing Sheet

METHOD AND APPARATUS FOR REGULATING CHAMBER PRESSURE

FIELD OF THE INVENTION

The present invention generally relates to a method and apparatus for regulating chamber pressure in a process chamber and more particularly, relates to a method and apparatus for regulating chamber pressure in a process chamber that operates at a pressure just below the atmospheric pressure by utilizing a pressure sensor for sensing a pressure in a chamber exhaust pipe and an inverter to vary the speed of a blower for exhausting a gas from the process chamber into the chamber exhaust pipe.

BACKGROUND OF THE INVENTION

In a semiconductor fabrication facility, the exhaust of various gases generated from the facility is an important aspect of the total fabrication process. Not only from a personnel health and safety point of view that the exhaust must be treated for converting various toxic components of the gases into non-toxic components, but also from the process reliability point of view of maintaining a constant exhaust pressure in exhaust duct works such that the chamber pressure of a process machine which has its exhaust connected to the exhaust duct works does not fluctuate with the pressure fluctuations in the duct works.

Various exhaust gases are produced in a semiconductor fabrication facility, these include general exhaust, scrubbed exhaust and solvent exhaust. For exhausting the general exhaust and the solvent exhaust, a system typically includes duct works, exhaust fans, by-passes, and stacks. For handling the scrubbed exhaust, a scrubber must be used for treating the exhaust before they can be released to the atmosphere. A by-pass system is normally provided which allows the drawing of outside air when the pressure at the suction side of the blower exceeds a preset value. In a general exhaust system, heat dissipated by the process equipment is normally removed. The general exhaust therefore does not normally contain acids, caustics, or solvents. In a solvent exhaust system, air containing solvents from the process equipment is removed. The equipment used in the exhaust system therefore requires to be explosion-proof for safety reasons. In the scrubbed exhaust system, air containing acids, caustics from the process equipment is removed. Various caustics exhaust gases such as ammonia, silane, or other toxic gases connected to a scrubber system for treatment. A wet scrubber can be used to remove acids and caustics from an exhaust air by washing the air with a solvent such as water. The waste water from the scrubber is then sent to a neutralization plant in a waste treatment area of the fabrication facility. A dry scrubber can also be used to remove toxic substances from an exhaust air by absorbing the substances into a scrubber material, typically at an elevated temperature. The scrubber material can be replaced when it is saturated with the toxic substances.

The various exhaust systems must be connected to a process machine via duct works. For instance, when exhausting from an atmospheric pressure chemical vapor deposition (APCVD) chamber or from a low pressure chemical vapor deposition (LPCVD) chamber, spent reactant gases and reaction by-products are normally exhausted to a scrubbed exhaust system for treatment before it is released to the atmosphere. An effective exhaust system for taking away such spent reactant gases and reaction by-products is therefore an important step of the chemical vapor deposition process. The spent reactant gases must be carried away such that the efficiency of the deposition process is not affected. Furthermore, the reaction by-products such as particles must also be carried away and prevented from depositing on the wafer surface as contaminants.

In an atmospheric pressure chemical vapor deposition chamber, the pressure of the chamber is kept only slightly below the atmospheric pressure, i.e., at approximately −0.5 inch $H_2O$ pressure. The exhaust from an APCVD chamber is normally directly connected to factory exhaust duct works in order to take away the spent reactant gases and reaction by-products. However, the pressure in factory exhaust duct works is not stable since the duck works are connected to a multiple number of process machines. In a chemical vapor deposition process, the maintenance of a constant chamber pressure is important for achieving the depositions of high quality films. When the pressure in the chamber is not constant, the deposition process fluctuates and films of poor quality and uniformity are thus produced. One attempt to improve the chamber pressure consistency in a chemical vapor deposition chamber is the use of an exhaust blower to compensate for the pressure fluctuations in the factory exhaust duct works and to assist in pressure control. This is shown in FIG. 1.

FIG. 1 shows a conventional exhaust system for an atmospheric pressure chemical vapor deposition chamber 12. An exhaust conduit 14 removes the exhaust gas from chamber 12 through a butterfly valve, or throttle valve 16. The throttle valve 16 is normally only partially opened to allow an exhaust gas to pass into conduits 18 and 20 into the factory exhaust duct works. An exhaust blower 24 is added to the system which is powered by an AC power supply 26 and controlled by switch 36 for transporting the exhaust gas taking exhaust from conduits 28 into conduit 32 and 20. The use of the exhaust blower 24 helps the stabilization of pressure in conduit 20 that is connected to the factory exhaust duct works 34. However, since the exhaust blower 24 is a single-speed blower, in order to maintain a suitable pressure in the APCVD chamber 12, the throttle valve 16 has to be substantially closed.

When the throttle valve 16 is in a substantially closed (or only slightly opened) position several problems can occur. First, due to the small opening of the throttle valve 16, a minute fluctuation in the exhaust pressure in conduit 20 can lead to in a large pressure fluctuation in the deposition chamber 12. The pressure fluctuation in the exhaust conduit 20 is therefore greatly amplified as large pressure fluctuations in the deposition chamber 12. Secondly, at a substantially closed position, the throttle valve 16 is more proned to gather particulate deposits on its surface. The particulate deposits in a powdery form become a source of serious contamination for the chamber 12. During any pressure fluctuations in the chamber 12, a back-fill of the contaminating particles from the throttle valve 16 becomes possible. Such back-fill causes contamination either to the chamber wall inside the deposition chamber 12 or to the wafer surface. The conventional exhaust system, even when assisted by an exhaust blower, does not function properly for maintaining a constant pressure in an APCVD or LPCVD chamber.

It is therefore an object of the present invention to provide an apparatus for regulating chamber pressure in a process chamber that does not have the drawbacks or shortcomings of the conventional exhaust systems for such process chambers.

It is another object of the present invention to provide an apparatus for regulating chamber pressure in a process chamber that allows the use of an exhaust blower for assisting the exhaust of reaction by-products from the deposition chamber.

It is a further object of the present invention to provide an apparatus for regulating chamber pressure in a process chamber that utilizes an exhaust blower and an inverter for regulating the blower speed such that the chamber pressure can be suitably adjusted by regulating the blower speed.

It is another further object of the present invention to provide an apparatus for regulating chamber pressure in a process chamber by utilizing a pressure regulating system consisting of a pressure gauge, a pressure controller, and an inverter for regulating the speed of the exhaust blower such that a consistent exhaust pressure can be maintained in the factory exhaust duct works.

It is still another object of the present invention to provide an apparatus for regulating chamber pressure in a process chamber by utilizing an automated feedback system of measuring the pressure in factory exhaust duct works and then regulating a blower speed for exhausting a suitable amount of gas from a deposition chamber such that the pressure in the factory exhaust duct works can be maintained substantially constant.

It is yet another object of the present invention to provide a chemical vapor deposition system that includes a deposition chamber and a pressure regulating system which utilizes a pressure gauge and an inverter for regulating the speed of an exhaust blower such that the exhaust pressure in factory exhaust duct works can be maintained consistent.

It is still another further object of the present invention to provide an exhaust regulating system by utilizing an inverter capable of regulating an AC power frequency at between about 20 and about 60 kHz for controlling the speed of an exhaust blower.

It is yet another further object of the present invention to provide a method for controlling chamber pressure in a process chamber by sensing a pressure in a factory exhaust conduit and comparing the pressure to a desirable exhaust pressure and then regulating the speed of an exhaust blower to thus achieve the desirable exhaust pressure.

SUMMARY OF THE INVENTION

In accordance with the present invention, an apparatus for regulating chamber pressure in a process chamber is provided which utilizes a pressure sensor for sensing pressure in a factory exhaust conduit and then regulating the speed of an exhaust blower by an inverter such that a suitable amount of gas is exhausted from a chemical vapor deposition chamber to maintain a constant exhaust pressure in the factory exhaust conduit.

In a preferred embodiment, an apparatus for regulating chamber pressure in a process chamber is provided which includes a pressure sensor for sensing pressure in a chamber exhaust pipe and for outputting a first signal to a controller, a controller for receiving and comparing the first signal with a stored datum and for outputting a second signal of a comparison result to an inverter, and an inverter for receiving an AC power at about 60 kHz and said second signal and outputting an AC power at a frequency of less than 60 kHz to a blower for exhausting a gas from a process chamber into the chamber exhaust pipe.

The present invention is also directed to a chemical vapor deposition system which includes a chemical vapor deposition chamber that has an exhaust pipe in fluid communication with a factory exhaust conduit, a pressure sensor for sensing pressure in the factory exhaust conduit and outputting a first signal to a controller, a controller for comparing the first signal with a stored pre-set pressure and outputting a second signal indicative of the comparison results to an inverter, and an inverter for receiving an AC power at about 60 kHz and said second signal for outputting an AC power at a frequency of less than 60 kHz to a blower for exhausting a gas from the chemical vapor deposition chamber into the factory exhaust conduit.

The present invention is further directed to a method for controlling chamber pressure in a process chamber which can be carried out by the operating steps of first providing a process chamber equipped with an exhaust pipe in fluid communication with a factory exhaust conduit, then sensing a pressure in a factory exhaust conduit by a pressure sensor and outputting a first signal to a controller, then comparing the first signal with a stored pre-set pressure in the controller and outputting a second signal indicative of the comparison result to an inverter, then inputting an AC power at about 60 kHz to an inverter and outputting an AC power at a frequency of less than 60 kHz to a blower, and then exhausting a gas from the process chamber by the blower into the factory exhaust conduit such that the pressure measured by the pressure sensor substantially equals the stored pre-set pressure in the controller.

BRIEF DESCRIPTION OF THE DRAWINGS

These and other objects, features and advantages of the present invention will become apparent from the following detailed description and the appended drawings in which FIG.

DETAILED DESCRIPTION OF THE PREFERRED EMBODIMENT

The present invention discloses a method and apparatus for regulating chamber pressure in a process chamber such as an APCVD or LPCVD chamber wherein the chamber pressure utilized is not significantly below the atmospheric pressure. The method and apparatus utilize a closed-loop control system which includes a pressure sensor, a pressure controller and an inverter for controlling the speed of an exhaust blower and thus regulating the amount of exhaust discharged from the process chamber to substantially maintain a constant exhaust pressure in a factory exhaust conduit.

The present invention apparatus substantially eliminates the disadvantages associated with a conventional exhaust system utilizes a single-speed blower for discharging the exhaust from a chemical vapor deposition chamber by regulating the blower speed such that only a regulated amount of gas is exhausted from the process chamber which allows a throttle valve mounted juxtaposed to the chamber to remain substantially open, and thus eliminating a large fluctuation in the exhaust pressure caused by a substantially closed valve. By utilizing the present invention novel closed-loop control system, the throttle valve remains in a substantially open position and further minimizing the deposition of contaminating particles on the throttle valve, which in turn minimizing the danger of a back-fill of the contaminating particles into the process chamber and causing serious contamination problems.

The present invention novel apparatus of a closed-loop pressure regulating system utilizes a pressure sensor, a pressure controller and an inverter in addition to the exhaust blower utilized in the conventional exhaust control system.

A pressure gauge is first used to measure the exhaust pressure in a factory exhaust conduit which is the sum of the factory exhaust pressure and the exhaust blower pressure. The pressure gauge then sends a signal to a pressure controller which compares the signal with a stored, pre-set desirable pressure and sends a second signal to an inverter. Based on the second signal, the inverter changes the frequency of an AC power input from 60 kHz to a lower frequency of between about 20 kHz and about 59 kHz. The lower frequency AC power is then sent to the exhaust blower for operating the blower at a lower rotational speed. The exhaust gas discharged from the deposition chamber is thus decreased to allow the throttle valve to open more and thus minimizing the danger of particulate deposition on the throttle valve and the possible back-fill of the contaminating particles into the chamber.

Figure 1:
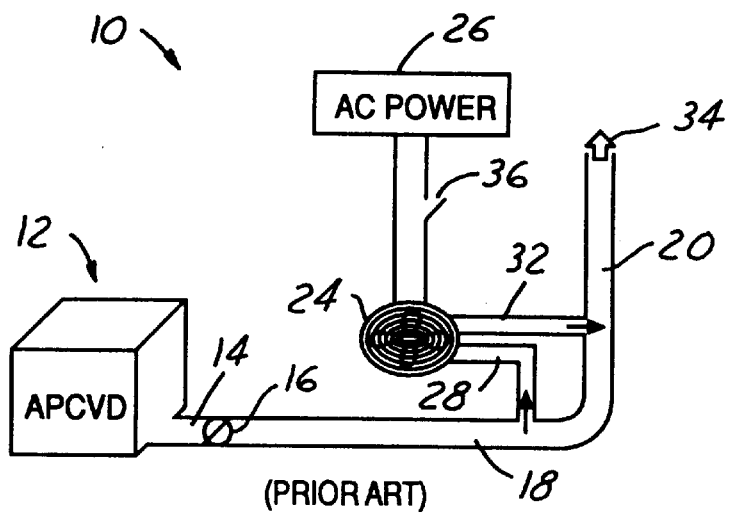
FIG. 1 is a schematic illustrating a conventional exhaust pressure regulating system utilizing an exhaust blower for the exhaust of an APCVD chamber.
Figure 2:
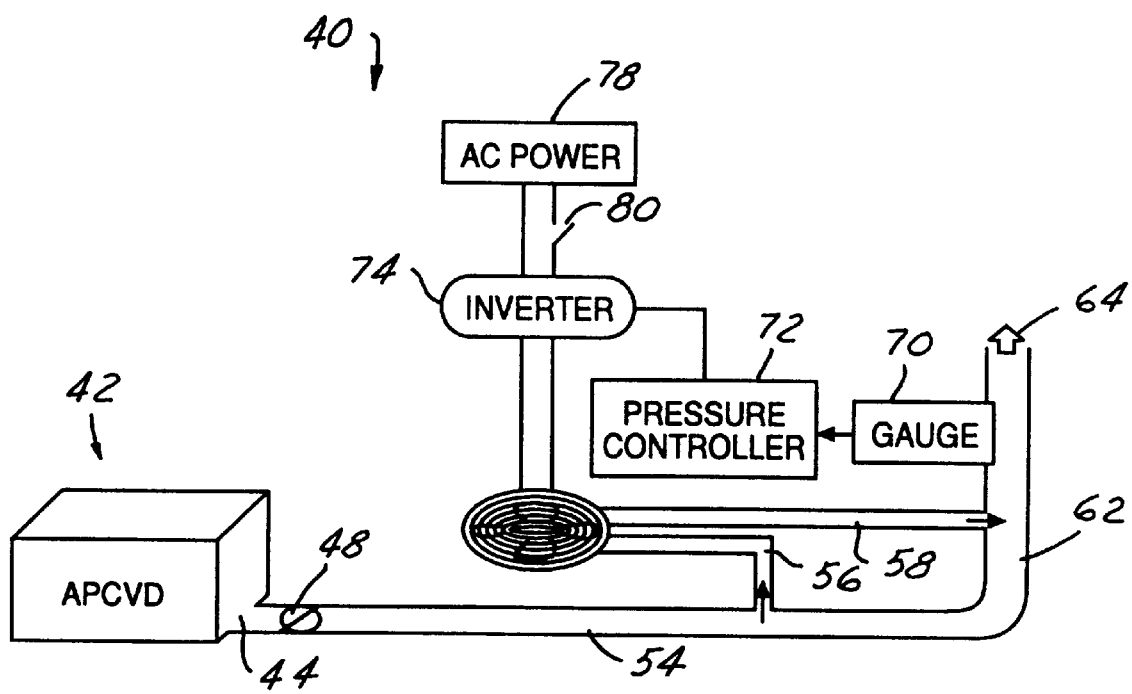
FIG. 2 is a schematic illustrating the present invention exhaust pressure regulating system utilizing a pressure gauge, a pressure controller and an inverter for regulating the blower speed for discharging exhaust from an APCVD chamber.

Referring now to FIG. 2, wherein a schematic of the present invention novel exhaust gas regulating system 40 is shown. In the exhaust gas regulating system 40, an APCVD chamber 42 is provided which has an exhaust port 44 for discharging spent reactant gases and reaction by-products from the chamber 42. Mounted juxtaposed to the chamber 42 is a throttle valve 48 used to regulate the exhaust flow from the chamber 42 when subjected to a suction from exhaust blower 52. The exhaust gas flow from chamber 42, after passing through throttle valve 48, enters conduits 54 and 56 by the suction force of the exhaust blower 52. Some exhaust gas may also enter conduit 62 for the direct discharge into the factory exhaust conduit 64. The present invention novel exhaust gas regulating system 40 includes the components of a pressure gauge 70, a pressure controller 72 and an inverter 74 which accepts an AC power from a power source 78. A switch 80 is provided for turning on and off of the AC power source 78.

The present invention novel exhaust pressure regulating system 40 operates in the following manner. The pressure gauge 70 first monitors a pressure reading in the exhaust conduit 62 and sends out a first signal to the pressure controller 72. The pressure controller 72 then compares the first signal indicative of the exhaust pressure in the conduit 62 with a pre-stored desirable exhaust pressure value. The results of the comparison is then sent out in a second signal to the inverter 74. The inverter 74 then accepts an AC power from power source 78 at a frequency of approximately 60 kHz and outputs an AC power at a frequency of less than 60 kHz to the exhaust blower 52. The frequency of the AC power output from the inverter 74 is most likely in the range between about 20 kHz and about 59 kHz. The exhaust blower 52, when received an AC power at a frequency of less than 50 kHz, reduces its rotational speed and thus reduces the amount of exhaust gas it discharges from the chamber 42. The exhaust gas discharged by the exhaust blower 52 is fed to the factory exhaust conduit 64 through conduit 58. By way of an example, when an exhaust pressure of 750 Torr is desired in the factory exhaust conduit 64, if the pressure gauge 70 measures a pressure of 755 Torr, i.e., 5 Torr higher, a second signal is sent to inverter 74 to decrease the frequency of the AC power that is sent to the exhaust blower 52 and thus slowing down the blower speed. The pressure gauge, operating in a closed-loop control system with the pressure controller 72 and the inverter 74, then monitors a new datum of the exhaust pressure again to repeat the cycle and thus complete the closed-loop control function. A desirable, pre-set exhaust pressure for the factory exhaust conduit 64 is normally pre-stored in the pressure controller 72 such that it is used as a calibration standard.

The present invention novel apparatus and method provide several major benefits. First, the chamber pressure of the APCVD chamber becomes more stable due to the stable exhaust pressure achieved in the factory exhaust conduit. Secondly, there is a significant reduction in the particulate contamination on the throttle valve 48 when the valve is operated in a more opened position and thus attracting lesser particles to deposit thereon. The back-fill problem for contaminating the process chamber 42 is consequently reduced.

The present invention novel method and apparatus has therefore been amply described and demonstrated by the above descriptions and the appended drawing FIG. 2. It should be noted that, while the present invention is demonstrated by using an example of an APCVD and a LPCVD chamber, any process chamber that operates at atmospheric pressure or a pressure slightly below the atmospheric pressure can utilize the present invention and achieve the same desirable results.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An apparatus for regulating chamber pressure in a semiconductor process chamber comprising:

a pressure sensor for monitoring pressure in a semiconductor process chamber exhaust pipe and outputting a first signal to a controller, a controller for receiving and comparing said first signal with a stored datum and for outputting a second signal indicative of a comparison result to an inverter, and an inverter for receiving said second signal and an AC power at a fixed frequency and outputting an AC power at a frequency of less than said fixed frequency to a blower for exhausting a gas from said process chamber into said chamber exhaust pipe.

2. An apparatus according to claim 1, wherein said semiconductor process chamber has a regulated chamber pressure of not less than 500 Torr.

3. An apparatus according to claim 1, wherein said semiconductor process chamber is an atmospheric pressure chemical vapor deposition (APCVD) chamber or a low pressure chemical vapor deposition (LPCVD) chamber.

4. An apparatus according to claim 1, wherein said stored datum in said controller is a pre-set chamber pressure.

5. An apparatus according to claim 1, wherein said inverter is a frequency controller.

6. An apparatus according to claim 1, wherein said pressure sensor senses a pressure in said chamber exhaust pipe indicative of a sum of a factory exhaust pressure and said chamber exhaust pressure.

7. An apparatus according to claim 1, wherein said fixed frequency is 60 kHz and said AC power outputted has a frequency of less than 60 kHz.

8. A chemical vapor deposition system comprising:

a chemical vapor deposition chamber having an exhaust pipe in fluid communication with a factory exhaust conduit, a pressure sensor for sensing pressure in said factory exhaust conduit and outputting a first signal to a controller, a controller for comparing said first signal with a stored pre-set pressure and outputting a second signal indicative of said comparison result to an inverter, and an inverter for receiving an AC power at about 60 kHz and said second signal and for outputting an AC power at a frequency of less than 60 kHz to a blower for exhausting a gas from said chemical vapor deposition chamber into said factory exhaust conduit.

9. A chemical vapor deposition system according to claim 8, wherein said chemical vapor deposition chamber is an atmospheric pressure chemical vapor deposition (APCVD) chamber or a low pressure chemical vapor deposition (LPCVD) chamber.

10. A chemical vapor deposition system according to claim 8, wherein said chemical vapor deposition chamber operates at a chamber pressure of not less than 500 Torr.

11. A chemical vapor deposition system according to claim 8, wherein said inverter changes an AC power frequency of 60 kHz to a frequency between about 20 kHz and about 59 kHz.

12. A chemical vapor deposition system according to claim 8, wherein said blower operates at a speed that is directly proportional to the frequency of an AC power input.

13. A chemical vapor deposition system according to claim 8, wherein said blower is a variable speed blower.

* * * * *